United States Patent [19]

Watanabe

[11] Patent Number: 4,527,259
[45] Date of Patent: Jul. 2, 1985

[54] SEMICONDUCTOR DEVICE HAVING INSULATED GATE TYPE NON-VOLATILE SEMICONDUCTOR MEMORY ELEMENTS

[75] Inventor: Takeshi Watanabe, Tokyo, Japan

[73] Assignee: Nippon Electric Co., Ltd., Tokyo, Japan

[21] Appl. No.: 420,028

[22] Filed: Sep. 20, 1982

[30] Foreign Application Priority Data

Sep. 22, 1981 [JP] Japan .................... 56-150393

[51] Int. Cl.$^3$ .................................. G11C 11/40
[52] U.S. Cl. ........................ 365/189; 364/131; 365/185; 365/114; 365/218
[58] Field of Search .......... 365/182, 185, 106, 114, 365/120, 189, 218; 364/131

[56] References Cited

U.S. PATENT DOCUMENTS 3,916,268 10/1975 Engeler et al. .............. 365/114
3,924,246 12/1975 Scherer ....................... 365/114
4,103,312 7/1978 Chang et al. ................ 365/114

Primary Examiner—Terrell W. Fears
Attorney, Agent, or Firm—Laff, Whitesel, Conte & Saret

[57] ABSTRACT

A highly integrated semiconductor device has two or more circuits employing non-volatile memory elements built into the same semiconductor substrate, along with read, write and erase, which may operate independently of each other. The memory includes first and second circuit sections, the first circuit section including a first non-volatile memory which is electrically writable and is erasable by ultra-violet rays, and the second circuit section including a second non-volatile memory which is electrically writable and electrically erasable, but which is not erasable by ultra-violet rays. The first circuit section may be a ROM section and the second circuit section may be a CPU in a microcomputer semiconductor device. The first non-volatile memory elements are preferably FAMOS type elements and the second non-volatile memory elements are preferably MNOS elements or F-N elements.

4 Claims, 7 Drawing Figures

SEMICONDUCTOR DEVICE HAVING INSULATED GATE TYPE NON-VOLATILE SEMICONDUCTOR MEMORY ELEMENTS

BACKGROUND OF THE INVENTION

The present invention relates to a semiconductor device having insulated gate type non-volatile non-changeable semiconductor memory elements (hereinafter abbreviated as "non-volatile memory elements"), and more particularly, to a semiconductor device having two or more circuits including non-volatile memory elements.

A semiconductor device for use in a microcomputer is a typical example of semiconductor devices having two or more circuits constructed of insulated gate semiconductor memory elements on a single semiconductor substrate. This semiconductor device contains, on a single semiconductor substrate, a central processing unit (hereinafter abbreviated as "CPU"), an input/output section (hereinafter abbreviated as "I/O" section) including an input circuit for inputting information contents from an external circuit and an output circuit for outputting information contents to an external circuit, a RAM section having random access memory elements ("RAM" elements) for reading or writing information contents therefrom or thereinto, and a ROM section having read-only semiconductor memory elements ("ROM" elements) for reading information contents therefrom. The CPU generates control signals for controlling the I/O section, RAM section and ROM section, and also contains an instruction decoder. The instruction decoder has a function of generating control signals by reading information contents in the RAM elements and the ROM elements forming the RAM section and the ROM section, respectively. The semiconductor memory elements forming this instruction decoder achieve the same function and have the same structure as the ROM elements forming the ROM section.

In order to write information contents in the ROM elements forming the above-mentioned instruction decoder and the ROM section, the prior art has used a method of writing during a manufacturing process of a semiconductor device. However, this type of semiconductor device had a shortcoming. After a semiconductor device has once left a manufacturing process, even if it is desired to rewrite memory contents in the memory elements therein, it is definitely impossible.

As one countermeasure for the above-mentioned shortcoming, a ROM device has employed non-volatile memory elements as semiconductor memory elements. Among the non-volatile memory elements, an MNOS element is known in which carriers are stored at a boundary surface between a silicon oxide film and a silicon nitride film. In the MNOS element, electrical writing and electrical erasing can be achieved. On the other hand, a non-volatile memory element having a floating gate electrode is also known which has been generally called FAMOS element, up to now. In this FAMOS element, electrical writing and erasing by irradiation of ultra-violet rays can be achieved. However, recently, an element has been developed with a floating gate electrode in which electrical writing and electrical erasing can be achieved. In this element, lower-energy electrons are made to pass through an oxide film under a floating gate electrode by making use of Fowler-Nordheim tunnels. The above-mentioned element having a floating gate electrode in which electrical erasing can be achieved, will be hereinafter called an "F-N element", for convenience.

The above-described non-volatile memory elements in a ROM section eliminate the previous shortcoming that it is not possible to rewrite the memory contents in the memory elements in a semiconductor device which has once left a manufacturing process. However, there would still remain a shortcoming in the case of rewriting the information contents of semiconductor memory elements in a CPU. They must be written during a manufacturing process which is similar to the above-described case.

As one solution for eliminating this shortcoming, the CPU may also have non-volatile memory elements similar to a ROM device. However, a resultant device would have the same type of non-volatile memory elements in a CPU and in a ROM section. Therefore semiconductor device would have the following shortcoming. If ultra-violet erasable FAMOS elements are employed in both the CPU and the ROM section, the erasing of information contents would be effected simultaneously in both the CPU and the ROM section. Hence it would be difficult to preserve the information contents in either the CPU or the ROM section and to erase information contents only in the other. Whereas, if MNOS elements or F-N elements, in which electrical erasing can be achieved, are employed in both of the CPU and the ROM section, upon erasing, it would be possible to preserve information contents in one of the CPU and the ROM section and to erase information contents in only the other. However, in the event that a large number of these electrically erasable non-volatile memory elements are arrayed in a matrix form, in order to effect electrical erasing and electrical writing, it would be necessary to connect at least one insulated gate type semiconductor element for selection to each MNOS element on the like. Therefore, the semiconductor device would have a shortcoming that it is not suitable to form a memory device having a large memory capacity by arraying the memory elements in a matrix form.

SUMMARY OF THE INVENTION

It is, therefore, one object of the present invention to provide a semiconductor device in which two or more circuits employing non-volatile memory elements are provided in a single semiconductor substrate, with read, write and erase operations being possible in the respective circuits, independently of each other, and in which these circuits can be formed at a high degree of integration.

According to one feature of the present invention, a semiconductor device comprises a semiconductor substrate. First and second circuit sections are provided in the semiconductor substrate, the first circuit section including first non-volatile memory elements which are electrically writable and erasable with ultra-violet rays. The second circuit section includes second non-volatile memory elements which are electrically writable and electrically erasable, but which are unable to be erased with ultra-violet rays.

The first circuit section may be a ROM section and the second circuit section may be a CPU in a microcomputer semiconductor device. The first non-volatile memory elements are preferably FAMOS type elements and the second non-volatile memory elements are preferably MNOS elements or F-N elements.

According to another feature of the present invention, a semiconductor device comprises a first circuit section including a plurality of first unit cells therein, and a second circuit section including a plurality of second unit cells therein. Each of the first unit cells is constructed of a first non-volatile memory element only which is electrically writable and erasable with ultraviolet rays. Each of the second unit cells is constructed of a second non-volatile memory element which is electrically writable and electrically erasable. One or two insulated gate field effect transistors are connected in series with the second memory element.

The above-mentioned and other features and objects of the present invention will become more apparent by reference to the following description of preferred embodiments of the invention taken in conjunction with the accompanying drawings.

DESCRIPTION OF PREFERRED EMBODIMENTS

First Preferred Embodiment

Figure 1:
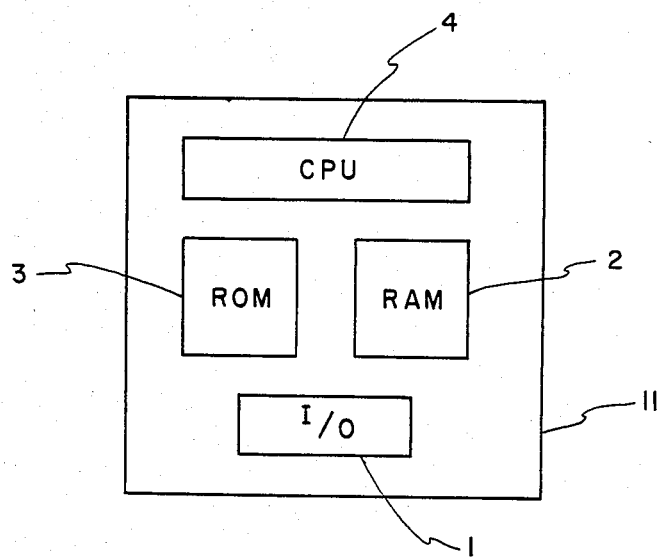
FIG. 1 is a layout diagram of one example of a microcomputer provided in a single semiconductor substrate.
Figure 2:
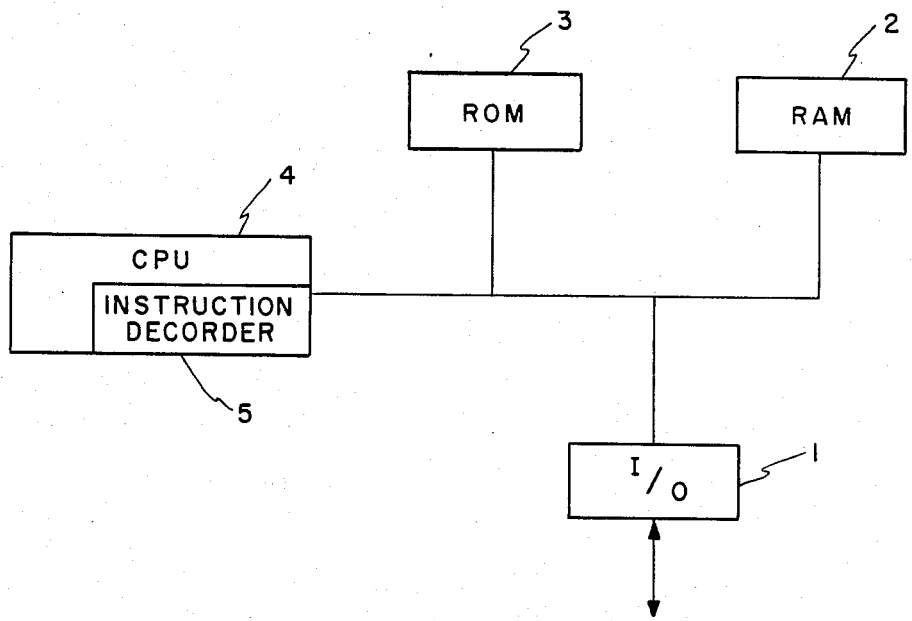
FIG. 2 is a block diagram of one example of a semiconductor device to be used as a microcomputer.
Figure 3:
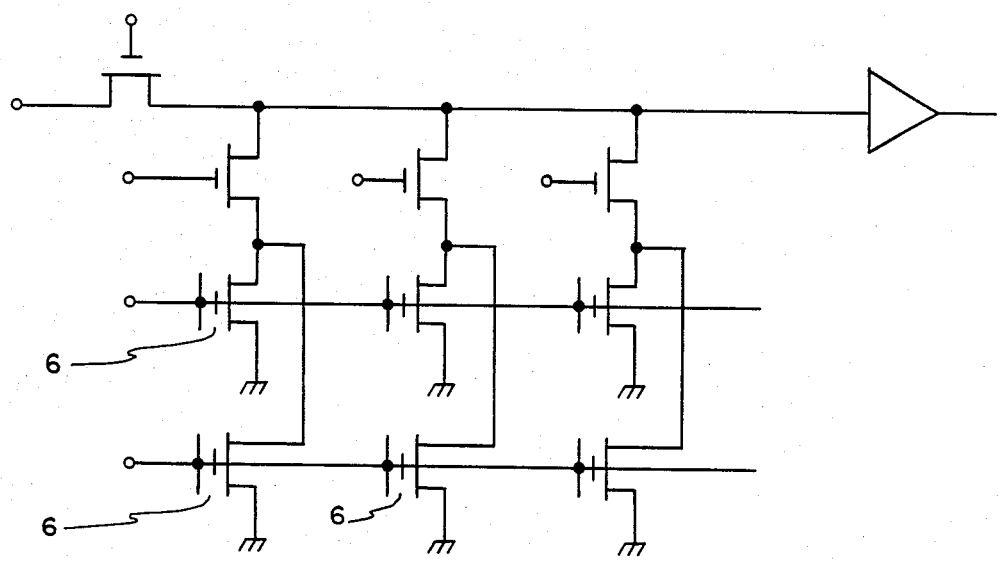
FIG. 3 is a circuit diagram showing one example of a part of a ROM section in FIGS. 1 and 2.

As shown in FIG. 1, an I/O section 1, a RAM section 2, a ROM section 3 and a CPU 4 are formed within a semiconductor substrate 11. These component sections are connected with each other as shown in FIG. 2. The CPU 4 contains an instruction decoder 5. As shown in FIG. 3, a large number of FAMOS elements 6, of ultraviolet erase type, are arrayed in a matrix form as non-volatile memory elements in the ROM section. The individual FAMOS elements 6 respectively form memory cells.

Figure 4:
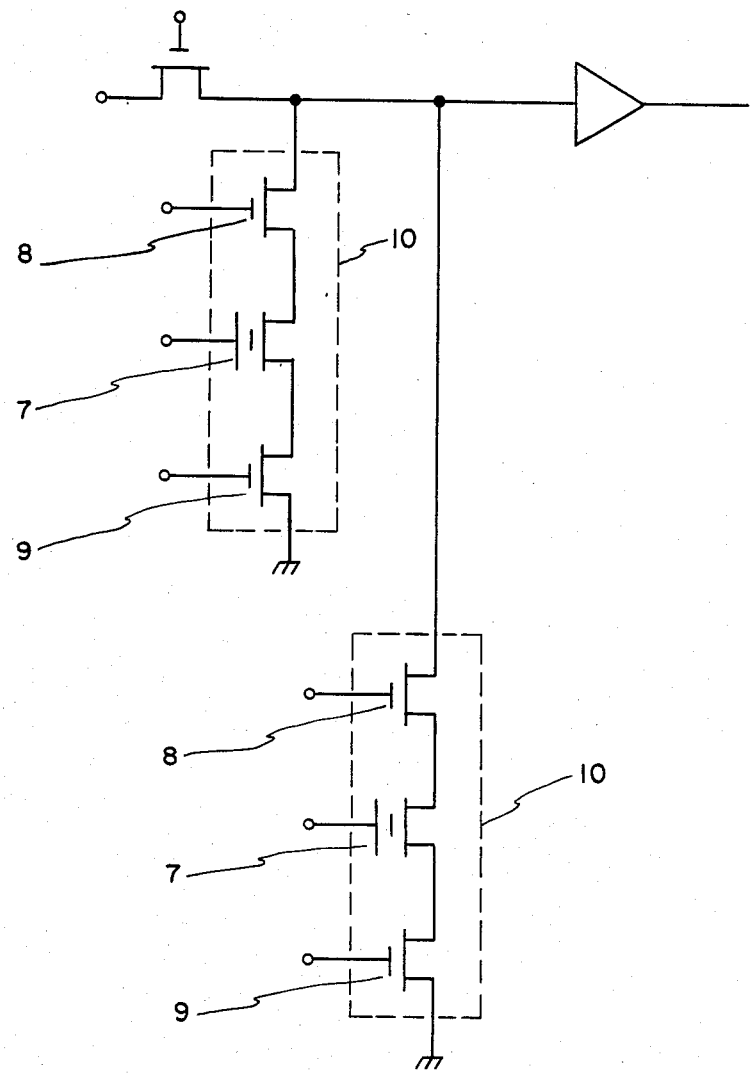
FIG. 4 is a circuit diagram showing one example of a part of a CPU which appears in FIGS. 1 and 2.

On the other hand, in the instruction decoder 5 (FIG. 2) within the CPU 4 are provided electrically erasable MNOS elements 7 (FIG. 4), each of which has insulated gate field effect transistors 8 and 9 connected in series, on its opposite sides. Unit cell 10 is constructed of the MNOS element 7 and the two transistors 8 and 9 as shown in FIG. 4. Many non-volatile memory elements are required in the ROM section. Therefore, it is advantageous to use ultra-violet erase type elements which can construct one unit cell, that is, one memory cell uses one element, because there is a high degree of circuit integration. On the other hand, within the CPU, not so many non-volatile memory elements are required. Even if electrically erasable non-volatile memory elements are employed with an associated selection transistor within each unit cell, the overall degree of circuit integration is not sacrificed so much. In this way, by employing electrically erasable non-volatile memory elements within the CPU, even if the ROM section is erased with ultra-violet rays, the information contents stored in the CPU can be preserved.

Figure 5:
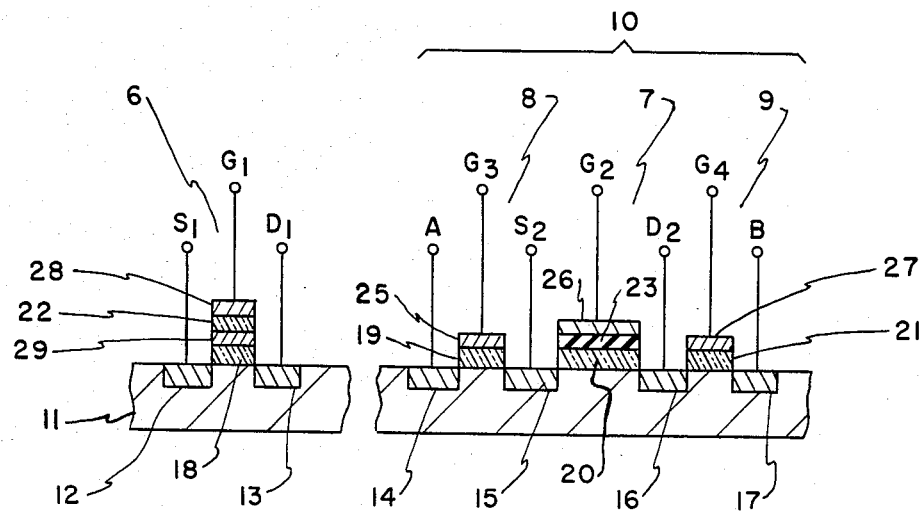
FIG. 5 is a schematic cross-sectional view showing a first preferred embodiment of the present invention.

FIG. 5 shows a schematic cross-sectional view of this preferred embodiment. Within a ROM section of a P-type semiconductor substrate 11 are provided $N^+$-type source and drain regions 12 and 13, and at the same time, $N^+$-type source and drain regions 14~17 are provided within a CPU.

In the FAMOS element 6 within the ROM section, a floating gate electrode 29 is provided on a silicon dixode film 18 of about 700 Å thickness which deposited on a substrate 11. A gate electrode 28 is made of a metallic layer is supported, via a silicon dioxide film 22 of about 700 Å thickness, on the floating gate electrode 29. A source electrode $S_1$ and a drain electrode $D_1$ are connected to the source and drain regions 12 and 13, respectively. Likewise, a gate wiring $G_1$ is connected to the gate electrode 28.

This memory element 6 is electrically writable, but erasable with ultra-violet rays. Writing in this memory element 6 is effected by injecting carriers into the floating gate electrode 29 by applying a high voltage to the gate electrode 28 and by applying a voltage between the drain electrode $D_1$ and the source electrode $S_1$. Erasing is effected by releasing the electric charge stored at the floating gate electrode 29 by irradiating the element with ultra-violet rays. In this instance, all of the memory elements 6 in the ROM section are simultaneously erased.

On the other hand, the non-volatile memory element employed in the instruction decoder 5 within the CPU 4 is a MNOS element 7, which a silicon nitride film 23 of 500 Å in thickness is provided on a silicon dioxide film of about 50 Å thickness deposited on the substrate 11. A gate electrode 26 consists of a metallic layer and is provided on the silicon nitride film 23. To a source region 15 and a drain region 16 of $N^+$-type in this element are connected a source electrode $S_2$ and a drain electrode $D_2$, respectively, and to the gate electrode 26 is connected a gate wiring $G_2$.

This memory element 7 has a MNOS structure. Element 7 is electrically writable and electrically erasable, but is unable to be erased even by irradiation of ultra-violet rays. It is possible to write in this memory element 7 by applying a high voltage between the gate electrode 26 and the semiconductor substrate 11.

Insulated gate field effect transistors 8 and 9 are read/write selection semiconductor elements to be used for effecting selective reading or writing in the case where the above-mentioned memory elements 7 of MNOS structure are arrayed in a matrix form. The transistor 8 is formed of an $N^+$-type source region 14, an $N^+$-type drain region 15, a gate insulating film 19 and a gate electrode 25. The transistor 9 is formed of an $N^+$-type source region 16, an $N^+$-type drain region 17, a gate insulating film 21 and a gate electrode 27. The elements 7 and 8 use the $N^+$-type region 15, in common, and the elements 7 and 9 use the $N^+$-type region 16 in common. Accordingly, the electrodes $S_2$ and $D_2$ are also used in common by adjacent two elements. In addition, to these two transistors are connected source and drain electrodes A and B, respectively, and gate wirings $G_3$ and $G_4$.

In the above-mentioned manner, a semiconductor device includes, in the same semiconductor substrate, first non-volatile memory elements 6 having a floating gate which is electrically writable, but erasable with ultra-violet rays, and second non-volatile memory elements 7 which is electrically writable and electrically erasable, but unable to be erased by inadiation of ultra-violet rays.

Figure 6:
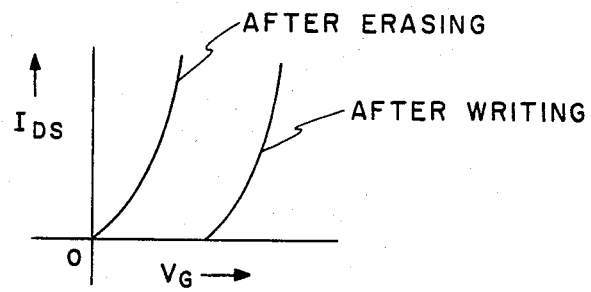
FIG. 6 is a characteristic diagram showing electrical characteristics after writing and after erasing of the preferred embodiment in FIG. 5.

A characteristic diagram in FIG. 6 shows electrical characteristics after writing and after erasing of the preferred embodiment shown in FIG. 5. A characteristic curve representing the relationship of a drain-source current $I_{DS}$ versus a gate voltage $V_G$ is displaced as shown in FIG. 6 as a result of writing or erasing.

In the case of carrying out a selective reading in the semiconductor device according to the first preferred embodiment of the present invention shown in FIG. 5, a read voltage is applied to the gate electrode 26 of the element 7. The element 8 is made conducting and a selection/non-selection is controlled by the element 9. In the case of carrying out a selective writing, a write voltage is applied to the gate electrode 26 of the element 7. The element 8 is made non-conducting and a selection/non-selection is controlled by the element 9. As described above, in the case of employing a MNOS structure, one unit cell necessitates three insulated gate type semiconductor elements. Whereas, in the case employing a FAMOS structure, only one insulated gate type semiconductor element will suffice.

Second Preferred Embodiment

Figure 7:
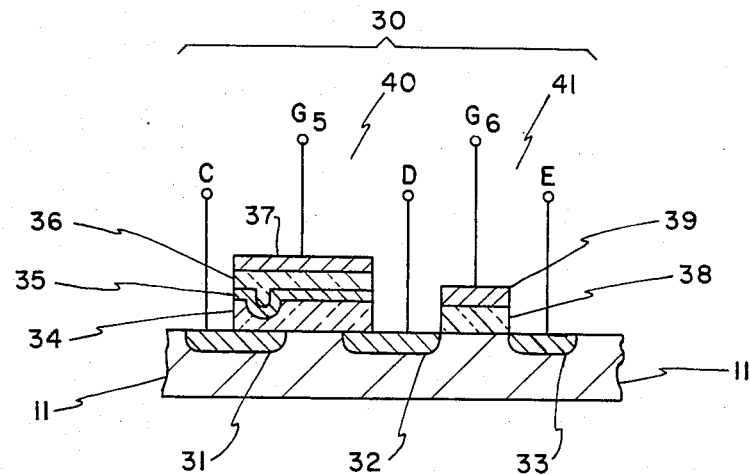
FIG. 7 is a schematic cross-sectional diagram showing an electrically erasable non-volatile memory element in a second preferred embodiment of the present invention.

In this second preferred embodiment, as shown in FIG. 7, an electrically erasable F-N element 40 is employed in place of the MNOS element 7 used in the first preferred embodiment. As shown in FIG. 7, one unit cell 30 is constructed by connecting one insulated gate field effect transistor 41 in series with the F-N element 40. More particularly, in the CPU are formed these unit cells 30. As non-volatile memory elements in the ROM section, ultra-violet erasable type FAMOS elements as shown in FIG. 5 are employed.

In the unit cell 30 within the CPU in this second preferred embodiment, N+type source and drain regions 31, 32 and 33 are provided in a P-type semiconductor substrate 11. On the channel region between the regions 31 and 32 is provided a silicon dioxide film 34 of 700 Å thickness. This silicon dioxide film 34 is thinned up to 200 Å at the position above the region 31. A floating gate electrode 35 of 2000 Å thickness made of polycrystalline silicon is provided on this silicon dioxide film 34. A gate electrode 37 made of polycrystalline silicon is provided above this floating gate electrode 35 via a silicon dioxide film 36 of 700 Å thickness. In this F-N element, stored carriers are allowed to pass through the thin portion of the silicon dioxide film 34 of 200 Å thickness by making use of Fowler-Nordheim tunnels, and thereby electrical erasing can be achieved. In addition, on the channel region between the regions 32 and 33 is provided a gate electrode 39 via a gate insulating film 38, and thereby a selection transistor 41 is formed. To the respective regions 31, 32 and 33 are connected electrodes C, D and E, respectively, and to the respective gate electrodes 37 and 39 are connected gate wirings $G_5$ and $G_6$, respectively.

Two selection transistors were required for one unit cell to achieve an electrical erasing in the first preferred embodiment. According to the second preferred embodiment, it becomes possible to achieve electrical erasing even if a one unit cell is constructed by employing a single selection transistor. However, it is to be noted that, to effect an electrical erasing, at least one selection transistor must always be provided in each unit cell. This is a distinct difference from the ultra-violet erasing type, non-volatile memory element which makes it possible to achieve write and erase operations without providing a selection transistor within each unit cell.

The present invention has been described above in connection with preferred embodiments thereof as applied to a semiconductor microcomputer device, in which electrically erasable non-volatile memory elements are employed within a CPU and ultra-violet erasable FAMOS elements are employed in a ROM section. However, the present invention should not be limited to the illustrated embodiments. That is, in the case where two or more ROM section are provided in a same semiconductor substrate, or in the case where an instruction decoder and a ROM section are provided in a same semiconductor substrate, on in a similar case, it becomes possible to provide a semiconductor device having a high degree of circuit integration in which erasing in the respective circuit sections can be achieved independently of each other, by employing ultra-violet erasable elements such as FAMOS elements in a circuit section having a large number of memory units (that is, having a large memory capacity) and employing electrically erasable elements such as MNOS elements or F-N elements in a circuit section having a small number of memory units (that is, having a small memory capacity). In addition, while the above preferred embodiments were described, assuming that all the semiconductor elements are of N-channel type, it is quite obvious that a similar description is valid even in the case of P-channel type.

As described in detail above, according to the present invention, there is provided a semiconductor device, in which two or more circuits sections employing read-only memory elements are provided in a same semiconductor substrate. It is possible to achieve reading, writing and erasing in the respective circuit sections independently of each other. The circuit sections can be formed at a high degree of integration.

What is claimed is:

1. A semiconductor processor device comprising a ROM, an input/output circuit, a RAM, and a central processing unit formed on a semiconductor substrate;

said ROM including a matrix of memory cells arranged in a plurality of rows and columns, each of said memory cells comprising a first insulated gate type non-volatile semiconductor memory transistor, each of said first memory transistors having a gate electrode connected to a row line, a floating gate electrode, a source region and a drain region, one of said source and drain regions being connected to a column line; means for selectively and electrically writing information in the first memory transistor; means for selectively and electrically reading information from said first memory transistor; and means using ultra-violet rays for erasing information stored in said first memory transistor;

said central processing unit having an instruction decoder, said instruction decoder including a matrix of memory cells arranged in a plurality of rows and columns, each of said memory cells comprising at least two insulated gate type transistors, one being a second non-volatile memory transistor and the other being a selection transistor connected in series with said second memory transistor; means for activating the selection transistor in order to select the associated second memory transistor; means for electrically writing information in the selected second memory transistor; means for electrically reading information from the selected second memory transistor; and means for erasing information stored in the selected second memory transistor electrically.

2. A semiconductor device comprising a semiconductor substrate; a first circuit section and a second circuit section formed in said substrate;

said first circuit section including a matrix of memory cells arranged in a plurality of rows and columns; each of said memory cells comprising of a first insulated gate type non-volatile semiconductor memory transistor, each of said first memory transistors having a gate electrode connected to a row line, a floating gate electrode, a source region and a drain region, one of said source and drain regions being connected to a column line; means for selectively and electrically writing information in the first memory transistor; means for selectively and electrically reading information from said first memory transistor; and means for erasing information stored in said first memory transistor with ultra-violet rays;

said second circuit section including a matrix of memory cells arranged in a plurality of rows and columns; each of said memory cells comprising of at least two insulated gate type transistors, one being a second non-volatile memory transistor and the other being a selection transistor connected in series with said second memory transistor; means for activating the selection transistor to select the associated second memory transistor; means for electrically writing information in the selected second memory transistor; means for electrically reading information from the selected second memory transistor; and means for electrically erasing information stored in the selected second memory transistor.

3. A semiconductor device of claim 2, in which said second non-volatile semiconductor memory transistor is an MNOS transistor of a type which stores carriers at a boundary surface between a silicon oxide film formed on said semiconductor substrate and a silicon nitride film formed on said silicon oxide film.

4. A semiconductor device of claim 2, in which said second non-volatile semiconductor memory transistor is of a type that electrical writing and electrical erasing are effected by making carriers pass through a thin portion of an oxide film under a floating gate electrode by utilizing Fowler-Nordheim tunnels.

* * * * *